United States Patent

[11] 3,546,362

[72] Inventor Raymond H. Berger
Ellicott City, Maryland
[21] Appl. No. 819,315
[22] Filed April 25, 1969
[45] Patented Dec. 8, 1970
[73] Assignee mesne assignments, to the United States of America as represented by the Secretary of the Navy.

[54] ELECTRONIC MODULE
2 Claims, 3 Drawing Figs.

[52] U.S. Cl. .......... 174/52, 29/624; 77/5; 174/35; 317/101
[51] Int. Cl. .......... H05k 5/00, H05k 9/00
[50] Field of Search .......... 174/52, 35, 35.4; 317/101(C), 101(CC); 339/17; 29/626(Inquired), 624(Inquired); 77/5

[56] References Cited

UNITED STATES PATENTS 3,063,134 11/1962 McGraw, Jr. .......... 174/52(.6)X
3,390,226 6/1968 Beyerlein .......... 174/52(.6)

*Primary Examiner*—Darrell L. Clay
*Attorney*—E. J. Brower, A. W. Collins and S. J. Bor

ABSTRACT: A shielded electronic module for complementary use with a printed circuit board having a sloping cylindrical boss concentric with each base pin on the module to provide electrical isolation therefor from the printed circuit board and to allow the passage of air through the associated through holes on said board.

INVENTOR.
RAYMOND H. BERGER
BY
[signature]
ATTORNEY

ELECTRONIC MODULE

The present invention relates generally to electronic modules, and more particularly to shielded or plated modules and their effective use with mating printed circuit boards.

Presently, due to the increased complexity and cost of modern electronic circuits and systems, a new technique in the construction and design of electronic equipment has been introduced to improve reliability and ease of maintenance, that is, modular construction. A module is a packaged assembly of wired components, built in standardized size and having plug-in or solderable pin terminations necessary to connect the module to other circuits, such as to mating printed circuit boards. Most contemporary electronic module components have a plurality of small spherical bosses molded into their bases so as to raise the module off the surface of any associated printed circuit board to prevent moisture entrapment therebetween and to provide for the free access and flow of air through the through holes in the printed circuit board during the soldering of the module base pins. These projecting bosses are effective for all modules that are not plated or shielded. However, on shielded modules, the bosses are also plated and electrically conductive and, since the bosses rest directly against the printed circuit boards, present the possibility that the circuit wiring on said boards may be shorted out. In order to prevent the short circuit condition from occurring, a Mylar spacer or other like nonconductive plastic material is inserted between the module and the printed circuit board. However, aside from the additional material cost inherent in this procedure, the spacer member lies directly against the printed circuit wiring which creates a moisture trap, the original condition sought to be corrected by using the spherical bosses.

It is therefore an object of the present invention to provide a novel and improved shielded electronic module configuration which can be effectively employed with a printed circuit board.

It is a further object of the present invention to provide a novel and improved plated electronic module configuration for mating use with a printed circuit board which prevents moisture entrapment therebetween and which permits the free access of air through the plated through holes of the printed circuit board during any necessary soldering operation.

It is another object of the present invention to provide a novel and improved shielded electronic module configuration which is relatively simple in construction and operation and yet highly reliable when used with a complementary printed circuit board.

Figure 1:
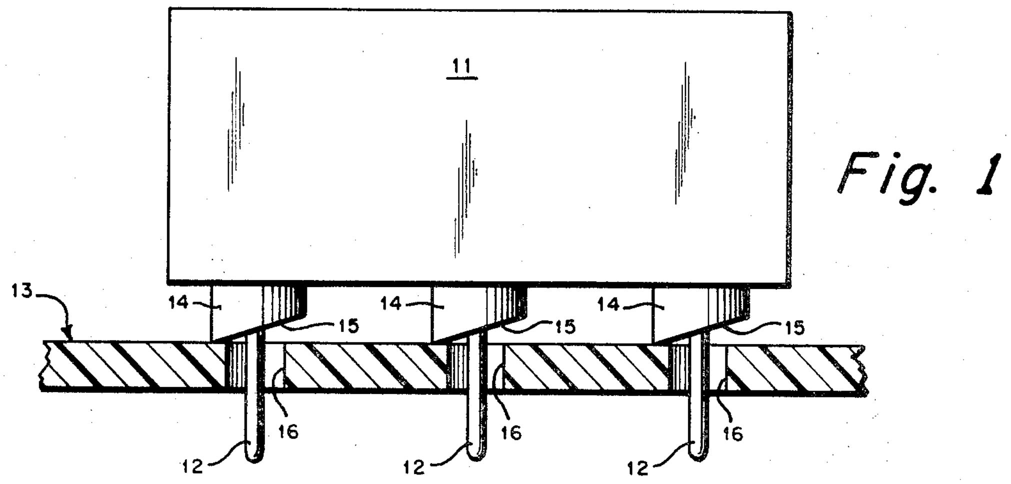
Figure 2:
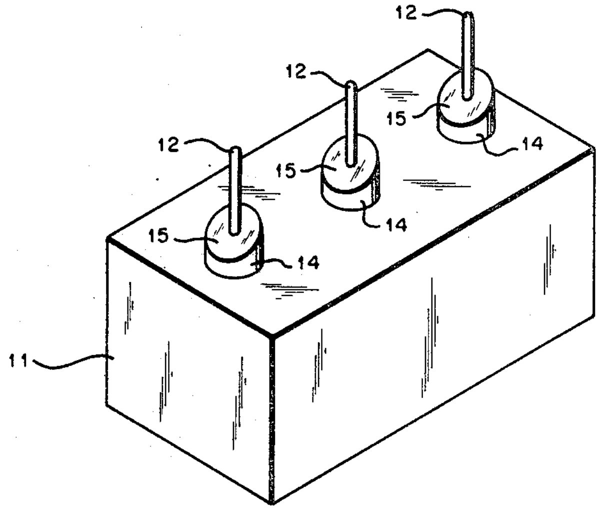
Figure 3:
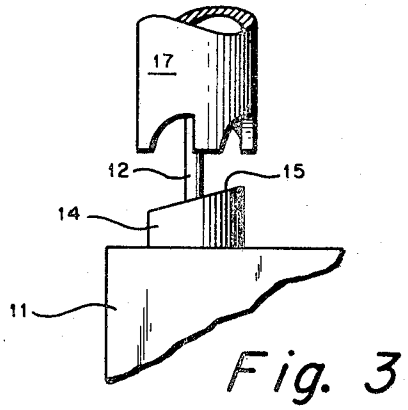

Other objects, advantages and novel features of the invention will become apparent from the following detailed description of the invention when considered in conjunction with the accompanying drawings wherein:

FIG. 1 of the drawing is a side view, partially in section, of an embodiment of an electronic module according to the invention;

FIG. 2 of the drawing is a perspective illustration of the electronic module shown in FIG. 1; and FIG. 3 of the drawing is a fragmentary side view of the inventive electronic module shown with an associated cutting tool.

Referring now to the drawing, wherein like reference numerals are used to designate like parts throughout, and in particular to FIGS. 1 and 2, there is illustrated an electronic module designated generally by the reference numeral 11. The module 11 comprises a number of base pins 12 protruding through the base of said module which are used for support and as solderable terminations necessary in coupling the circuitry of the module 11 to the wiring on a printed circuit board 13, for example, which will become more apparent hereinafter. It is to be noted that the module 11 is preferably shielded or plated, as with a one-half mil of copper plating, for example, so that it is necessary to isolate the module from the printed circuit board 13 to prevent any short-circuit malfunctions therein.

To accomplish this, the module 11 is provided with a cylindrical sleeve or boss 14 surrounding and concentric with each of the base pins 12. The bosses 14 are provided with a sloping base portion 15 having an oblique slanted surface which is formed integrally with the module 11, and preferably molded therewith, whose operation will become more apparent hereinafter. When the module 11 is positioned on a printed circuit board for interconnection therewith, as shown in FIG. 1, the connecting base pins 12 extend through apertures or through holes 16 provided in the circuit board 13 and aligned adjacent each of the pins. The diameter of the bosses 14 are made slightly larger than the diameter of the through holes 16 so that they rest on the board 13 and the module 14 is positioned above the board to thereby prevent the possibility of a short circuit occurring or the entrapment of any moisture therebetween. In addition, because of the sloping base portion 15 provided on the bosses 14, the through holes 16 are not completely covered when the module 11 is supported by the printed circuit board 13. This provides a passageway for the free access and flow of air through the holes 15 during the soldering operation. The sloping base portion 15 therefore permits the free penetration of solder into the through holes 16 of the printed circuit board 13. Any obstruction to the clear passage of air into the through holes 16 are not completely covered when the module 11 is supported by the printed circuit board 13. This provides a passageway for the free access and flow of air through the holes 15 during the soldering operation. The sloping base portion 15 therefore permits the free penetration of solder into the through holes 16 of the printed circuit board 13. Any obstruction to the clear passage of air into the through holes 16 would interfere with the solder forming a continuous plug therethrough, which is a desired condition.

In operation, the bosses 14 also act as a pilot or guide for the trepanning operation which is performed on the module 11 prior to placement on the circuit board 13. Trepanning is the machining operation that removes the conductive shielding or plating that surrounds the module base pins 12. In the past, the cutting tool used would locate on and fit over the module base pins themselves. This resulted in bent and broken pins as they are not formed with the structural rigidity to resist any lateral movement of the cutter as it attempts to bite into the module plating. Referring now to FIG. 3 of the drawing, it can be seen that the cutting tool 16 fits around and is guided by the boss 14 during the trepanning operation. The boss 14 provides a degree of rigidity and stability to resist any lateral movement of the tool 16 which thereby keeps the amount of plating removed to within the necessary tolerance and increases the effectiveness of the overall shielding.

Obviously, many modifications and variations of the present invention are possible in the light of the above teachings. For example, it is to be noted that although the module 11 has been shown with three operational base pins 12, any number necessary for the proper operation of the associated circuitry may be used. It is therefore to be understood that, within the scope of the appended claims, the invention may be practiced otherwise than as specifically described.

I claim:

1. In an electronic module for use with a printed circuit board having a plurality of through holes, said module comprising a plurality of mating base pins, each provided to extend through an associated through hole, the improvement wherein a plurality of cylindrical bosses having a diameter larger than said through holes are provided concentrically with each of said base pins extending along a portion of the length thereof, said bosses having a sloping base so that the module is isolated from the circuit board and air is permitted to flow freely through said through holes during any associated soldering operation.

2. An electronic module comprising:

a. a plurality of base pins projecting from the base of said module;

b. and a substantially cylindrical boss member axially aligned with each of said base pins, said boss members extending a distance along the length of said pins and having an oblique base.